(12) United States Patent
Takasu et al.

(10) Patent No.: US 10,930,861 B2
(45) Date of Patent: Feb. 23, 2021

(54) RADIATION DETECTOR AND METHOD FOR MANUFACTURING THE SAME

(71) Applicant: KABUSHIKI KAISHA TOSHIBA, Minato-ku (JP)

(72) Inventors: Isao Takasu, Setagaya (JP); Hyangmi Jung, Yokohama (JP); Kohei Nakayama, Kawasaki (JP); Yuko Nomura, Kawasaki (JP); Rei Hasegawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 21 days.

(21) Appl. No.: 16/292,380

(22) Filed: Mar. 5, 2019

(65) Prior Publication Data

US 2020/0091440 A1 Mar. 19, 2020

(30) Foreign Application Priority Data

Sep. 18, 2018 (JP) .............................. JP2018-173747

(51) Int. Cl.
*H01L 51/00* (2006.01)
*G01T 1/24* (2006.01)
(Continued)

(52) U.S. Cl.
CPC ............ *H01L 51/0078* (2013.01); *G01T 1/24* (2013.01); *H01L 51/0036* (2013.01); *H01L 51/0039* (2013.01); *H01L 51/0042* (2013.01); *H01L 51/0043* (2013.01); *H01L 27/305* (2013.01); *H01L 51/001* (2013.01); *H01L 51/0003* (2013.01); *H01L 51/0021* (2013.01);
(Continued)

(58) Field of Classification Search
None
See application file for complete search history.

(56) References Cited

U.S. PATENT DOCUMENTS

2013/0126743 A1* 5/2013 Iwakiri ................ A61B 6/4216
250/366
2016/0320494 A1* 11/2016 Hartmann ................. G01T 1/16
(Continued)

FOREIGN PATENT DOCUMENTS

JP 2017-073426 4/2017
JP 2018-155720 10/2018

OTHER PUBLICATIONS

B. Fraboni, et al., "Organic Semiconducting Single Crystals as Next Generation of Low-Cost, Room-Temperature Electrical X-ray Detectors", Advanced Materials, vol. 24, No. 17, 2012, pp. 2289-2293.
(Continued)

*Primary Examiner* — Angel Roman
(74) *Attorney, Agent, or Firm* — Oblon, McClelland, Maier & Neustadt, L.L.P.

(57) ABSTRACT

According to one embodiment, a radiation detector includes a detection element. The detection element includes a first conductive layer, a second conductive layer, and an organic semiconductor layer provided between the first conductive layer and the second conductive layer. The organic semiconductor layer includes a first compound and a second compound. The first compound is bipolar. A thickness of the organic semiconductor layer is 50 μm or more.

19 Claims, 4 Drawing Sheets

(51) Int. Cl.
  *H01L 51/44* (2006.01)
  *H01L 51/42* (2006.01)
  *H01L 27/30* (2006.01)

(52) U.S. Cl.
  CPC ........ *H01L 51/4253* (2013.01); *H01L 51/442* (2013.01); *H01L 51/448* (2013.01); *H01L 2251/308* (2013.01)

(56) References Cited

U.S. PATENT DOCUMENTS

2016/0327655 A1* 11/2016 Hartmann ................ G01T 1/20
2017/0322323 A1* 11/2017 Fischer .................... G21K 4/00
2018/0277779 A1    9/2018 Takasu et al.
2018/0329080 A1* 11/2018 Brabec ................ G01T 1/2018
2019/0148659 A1*  5/2019 Jung .................. H01L 51/4253
                                                       257/40

OTHER PUBLICATIONS

B. Fraboni, et al., "Ionizing Radiation Detectors Based on Solution-Grown Organic Single Crystals", Advanced Materials, vol. 26, 2016, pp. 2276-2291.
A. Ciavatti et al., "Dynamics of Direct X-ray Detection Processes in High-Z $Bi_2O_3$ Nanoparticles-loaded PFO polymer-based diodes", Applied Physics Letters, vol. 111, 2017, 6 pages.

* cited by examiner

RADIATION DETECTOR AND METHOD FOR MANUFACTURING THE SAME

CROSS-REFERENCE TO RELATED APPLICATIONS

This application is based upon and claims the benefit of priority from Japanese Patent Application No. 2018-173747, filed on Sep. 18, 2018; the entire contents of which are incorporated herein by reference.

FIELD

Embodiments described herein relate generally to a radiation detector and a method for manufacturing the same.

BACKGROUND

It is desirable to increase the detection accuracy of a radiation detector.

DETAILED DESCRIPTION

Figure 1:
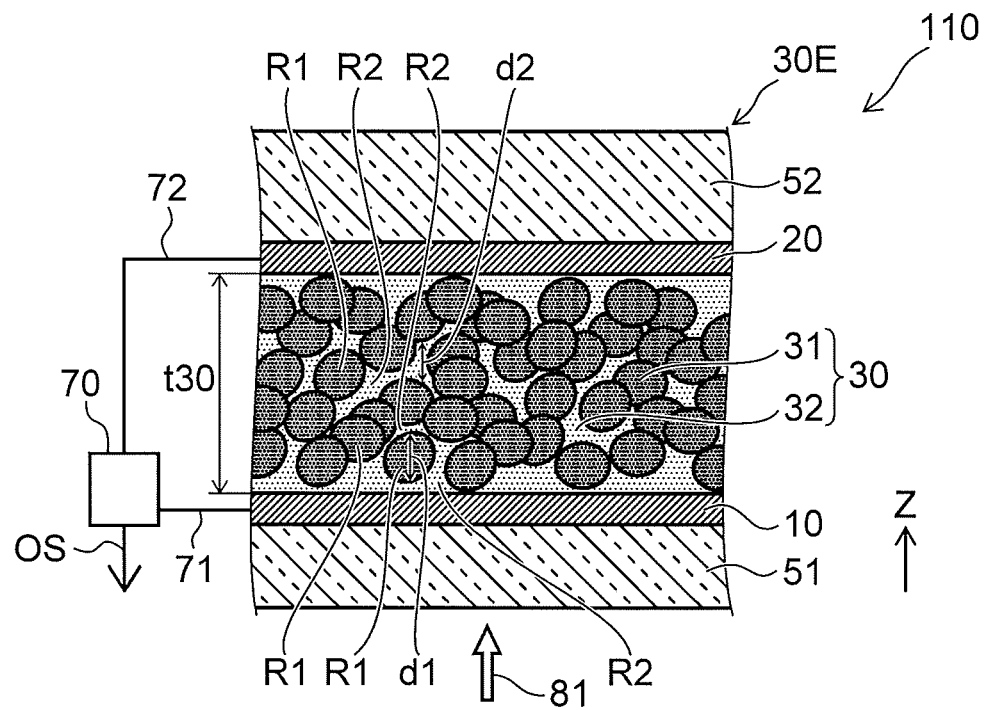
FIG. 1 is a schematic cross-sectional view illustrating a radiation detector according to a first embodiment.

According to one embodiment, a radiation detector includes a detection element. The detection element includes a first conductive layer, a second conductive layer, and an organic semiconductor layer provided between the first conductive layer and the second conductive layer. The organic semiconductor layer includes a first compound and a second compound. The first compound is bipolar. A thickness of the organic semiconductor layer is 50 µm or more.

According to another embodiment, a method for manufacturing a radiation detector is disclosed. The method can include forming an organic semiconductor layer including a first compound and a second compound by applying pressure to a mixture. A plurality of particles including the first compound and a plurality of particles including the second compound are mixed in the mixture. The first compound is bipolar, and a thickness of the organic semiconductor layer is 50 µm or more. The method can include forming a first conductive layer and a second conductive layer electrically connected to the organic semiconductor layer. The organic semiconductor layer is provided between the first conductive layer and the second conductive layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a radiation detector according to a first embodiment.

Figure 2A:
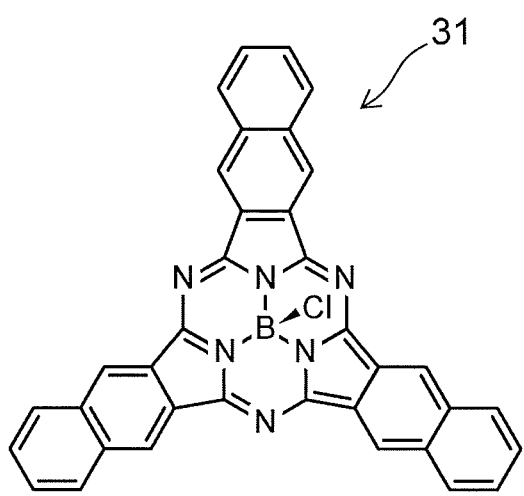
FIG. 2A and FIG. 2B are schematic views illustrating materials of the radiation detector according to the first embodiment
Figure 2B:
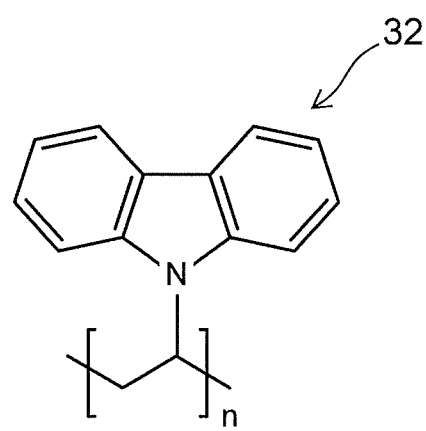

FIG. 2A and FIG. 2B are schematic views illustrating materials of the radiation detector according to the first embodiment.

As shown in FIG. 1, the radiation detector 110 according to the first embodiment includes a detection element 30E. The detection element 30E includes a first conductive layer 10, a second conductive layer 20, and an organic semiconductor layer 30.

The organic semiconductor layer 30 includes a first compound 31 and a second compound 32. The first compound 31 is an organic substance. The second compound 32 also is an organic substance.

The first compound 31 is bipolar. Electrons and holes are generated in the first compound 31 when irradiated with radiation. Further, unlike a normal n-type material or p-type material, both of the generated charges of electrons and holes can flow in the first compound 31.

The second compound 32 is, for example, a binder resin.

FIG. 2A and FIG. 2B respectively show examples of the first compound 31 and the second compound 32.

In one example, the first compound 31 includes at least one selected from the group consisting of boron subnaphthalocyanine chloride (e.g., boron sub-2,3-naphthalocyanine chloride (SubNc)) and a derivative of boron naphthalocyanine in which the Cl of SubNc is replaced with a substituent from an organic compound or a halogen. In the embodiment, the first compound 31 may include at least one of boron naphthalocyanine fluoride, boron naphthalocyanine bromide, or boron naphthalocyanine phenyl. Thus, the first compound 31 may include at least one selected from the group consisting of boron subnaphthalocyanine chloride and a derivative of boron naphthalocyanine chloride.

In one example, the second compound 32 includes at least one selected from the group consisting of polyvinyl carbazole (PV K), polyfluorene (PFO), poly(9,9-dioctyl-9H-fluorene-2,7-diyl)-alt-2,2'-bithiophene-5,5'-diyl (F8T2), and poly(9,9-dioctylfluorene-alt-benzothiadiazole) (F8BT).

The first compound 31 and the second compound 32 are mixed with each other.

For example, the organic semiconductor layer 30 includes a first region R1 including the first compound 31, and a second region R2 including the second compound 32. In one example as shown in FIG. 1, a portion of the second region R2 is between multiple portions of the first region R1. In one example as shown in FIG. 1, a portion of the first region R1 is between multiple portions of the second region R2.

The organic semiconductor layer 30 may have, for example, a bulk heterojunction structure.

A first member 51 and a second member 52 are provided in the example. The first conductive layer 10 is provided between the first member 51 and the second member 52. The second conductive layer 20 is provided between the first conductive layer 10 and the second member 52. The first member 51 is, for example, a substrate. The second member 52 is, for example, a sealing member. The first member 51 and the second member 52 are provided as necessary and may be omitted.

The direction from the first conductive layer 10 toward the second conductive layer 20 is taken as a Z-axis direction. The layers recited above are stacked along the Z-axis direction.

Radiation 81 is incident on the detection element 30E. The radiation 81 includes, for example, β-rays. The radiation 81 may include γ-rays. The radiation 81 may include α-rays.

The incident direction of the radiation 81 is arbitrary. In the example, the radiation 81 is incident on the organic semiconductor layer 30 via the first conductive layer 10. A movable charge is generated in the organic semiconductor layer 30 by the energy of the incident radiation 81. The charge is extracted by applying a bias voltage between the first conductive layer 10 and the second conductive layer 20.

For example, a detection circuit 70 is provided. The detection circuit 70 is electrically connected to the first conductive layer 10 and the second conductive layer 20. For example, the electrical connection is performed by a first interconnect 71 connected to the first conductive layer 10 and a second interconnect 72 connected to the second conductive layer 20. The detection circuit 70 includes, for example, a charge amplifier. The first conductive layer 10 (the first interconnect 71) and the second conductive layer 20 (the second interconnect 72) are electrically connected to the inputs of the charge amplifier. The output of the charge amplifier is an output signal OS. The output signal OS changes according to the radiation 81. Thus, the detection circuit 70 is configured to output a signal (the output signal OS) corresponding to the radiation 81 that is incident on the detection element 30E.

In the embodiment, a thickness t30 of the organic semiconductor layer 30 is, for example, 50 μm or more. The thickness t30 may be 100 μm or more. In one example, the thickness t30 is 1000 μm or less. The thickness t30 is the length along the Z-axis direction.

By setting the thickness t30 of the organic semiconductor layer 30 to be in the ranges recited above, the radiation 81 can be detected with high accuracy as described below.

An example of the case where β-rays are detected will now be described. Generally, γ-rays often exist in an environment where β-rays are detected. To detect the target radiation 81 (in this case, β-rays) with high accuracy, it is desirable for the target radiation 81 not to be affected easily by other radiation (γ-rays, etc.).

The organic semiconductor layer 30 is used in the embodiment. An organic substance is included in the organic semiconductor layer 30. An element that has a small atomic weight is included in the organic substance; and an element that has a large atomic weight is not included in the organic substance. Therefore, γ-rays pass through the organic semiconductor layer 30. Therefore, in the embodiment, the effects of γ-rays are suppressed.

On the other hand, β-rays can be detected with high sensitivity by setting the organic semiconductor layer 30 to have a thickness of a constant value or more. In the case where the organic semiconductor layer 30 is excessively thin, the sensitivity to β-rays decreases.

In the embodiment, the thickness t30 of the organic semiconductor layer 30 is 50 μm or more. Thereby, high sensitivity to β-rays is obtained.

On the other hand, in the case where the thickness t30 of the organic semiconductor layer 30 is excessively thick (e.g., 1000 μm or more), a portion of the γ-rays may be absorbed by the organic semiconductor layer 30. In such a case, a signal that corresponds to the γ-rays is detected as noise.

By setting the thickness t30 of the organic semiconductor layer 30 not to be excessively thick, the effects of the γ-rays can be suppressed; and the β-rays can be detected with high accuracy.

In the embodiment, a radiation detector can be provided in which the detection accuracy of the target radiation 81 can be increased.

In the embodiment, for example, the detection sensitivity to β-rays is higher than the detection sensitivity to γ-rays.

In one example, for example, the organic semiconductor layer 30 is made by pressure molding. The thickness t30 such as that recited above is obtained easily by using pressure molding.

For example, a method may be considered in which the organic semiconductor layer 30 is formed by vacuum vapor deposition, etc. In such a case, the thickness of the layer that can be formed stably is about 1 μm or less. Cracks, etc., occur when a thick layer is formed.

For example, it also may be considered to make the organic semiconductor layer 30 by coating a solution used to form the organic semiconductor layer 30. In such a case, the solution is limited by the solubility; as a result, it is difficult for the obtained layer to be thick.

By using pressure molding, the thickness t30 of 50 μm or more can be obtained stably and uniformly.

In the case where pressure molding is used, a method may be considered in which a p-type material and an n-type material are mixed. In such a case, it is difficult to cause the p-type material and the n-type material to have the appropriate mixed state. For example, it is difficult to obtain a state in which the p-type material and the n-type material mix with each other in an extremely fine region. It is difficult to cause the density of the interface between the p-type material and the n-type material to be sufficiently high. Therefore, it is difficult to obtain a sufficient conversion efficiency.

In the embodiment, the bipolar first compound 31 is used. Therefore, a sufficiently high conversion efficiency is obtained in the first compound 31. Also, the second compound 32 (the binder resin) is used in addition to such a first compound 31. Thereby, a state is obtained in which the first compound 31 is dispersed in the organic semiconductor layer 30.

For example, in the case where a thicker layer is formed by pressure molding using only the first compound 31, the layer is brittle; and it is difficult to obtain sufficient mechanical strength.

By mixing the first compound 31 with the second compound 32 functioning as a binder and by performing pressure molding, the organic semiconductor layer 30 that has sufficient mechanical strength is obtained.

In the embodiment, the first compound 31 and the second compound 32 are mixed to have moderate sizes.

For example, the organic semiconductor layer 30 includes multiple first particles (e.g., the first region R1). The multiple first particles (e.g., the first region R1) include the first compound 31. The average of a size d1 for the multiple first particles (e.g., the first region R1) (referring to FIG. 1) is, for example, not less than 0.1 μm and not more than 10 μm.

For example, the organic semiconductor layer 30 includes multiple second particles (e.g., the second region R2). The multiple second particles (e.g., the second region R2) includes the second compound 32. The average of a size d2 for the multiple second particles (e.g., the second region R2) (referring to FIG. 1) is, for example, not less than 0.1 µm and not more than 10 µm.

For example, information relating to the sizes recited above is obtained by electron microscopy of a cross section of the organic semiconductor layer 30, etc.

For example, the sizes recited above may be taken to be the lengths along the Z-axis direction for convenience. Or, the maximum length of one particle may be taken to be the size for the sizes recited above. For example, in the case where it is difficult to measure the maximum length, for example, the length along the Z-axis direction of the particle may be used as the size for convenience.

The concentration of the first compound 31 in the organic semiconductor layer 30 is not less than 50 weight % and not more than 95 weight %. In the case where the concentration is excessively low, for example, the sensitivity to the radiation 81 may decrease. In the case where the concentration is excessively high, for example, the mechanical strength decreases easily.

Because the organic semiconductor layer 30 includes the moderate concentration of the binder resin (the second compound 32), a practical mechanical strength of the organic semiconductor layer 30 is obtained. For example, the adhesion force between the organic semiconductor layer 30 and the conductive layers can be practically high.

It is favorable for a material having a wide bandgap to be used as the second compound 32. Thereby, for example, the charge that flows in the first compound 31 can be suppressed from being trapped in the second compound 32; and the obstruction of the transport of the charge can be suppressed. The material that has the wide bandgap is, for example, at least one selected from the group consisting of PVK, PFO, and F8BT, etc.

An example of a characteristic of the radiation detector 110 will now be described. In the sample of the following example, the first compound 31 is SubNc. The second compound 32 is PVK. These materials are powders. The diameter (the size) of the powder is about 1 µm. The organic semiconductor layer 30 is formed by mixing these materials and by performing pressure molding. The thickness t30 of the organic semiconductor layer 30 is 306 µm. The concentration of the first compound 31 in the organic semiconductor layer 30 of the sample is 80 weight %. The sample has the configuration of a glass substrate/ITO electrode (first conductive layer 10)/planarization film/organic semiconductor layer 30/Al electrode (second conductive layer).

Figure 3A:
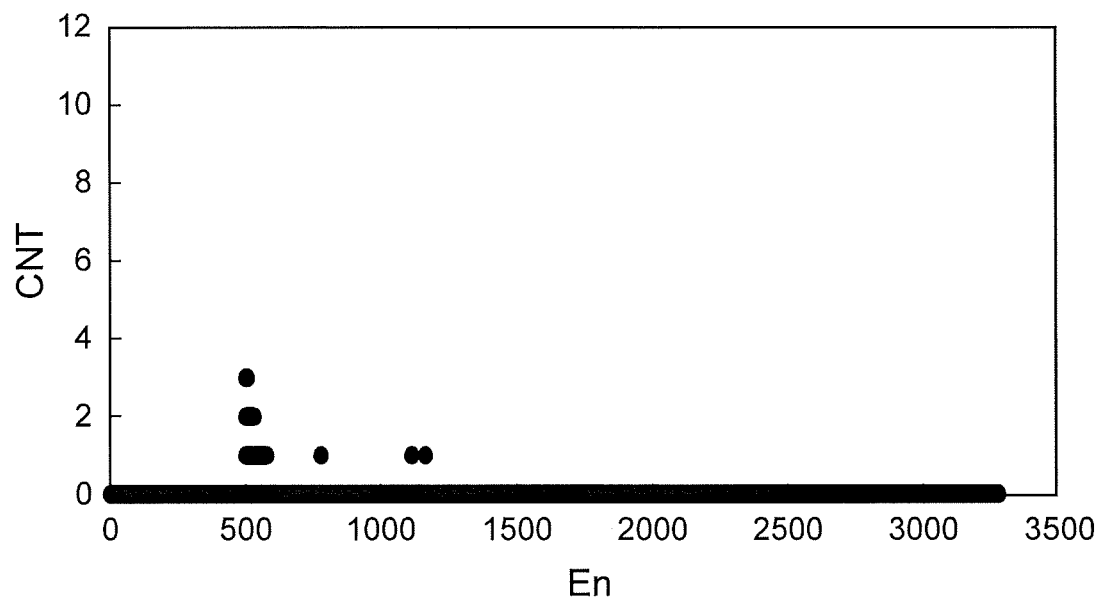
FIG. 3A and FIG. 3B are graphs illustrating the characteristic of the radiation detector.
Figure 3B:
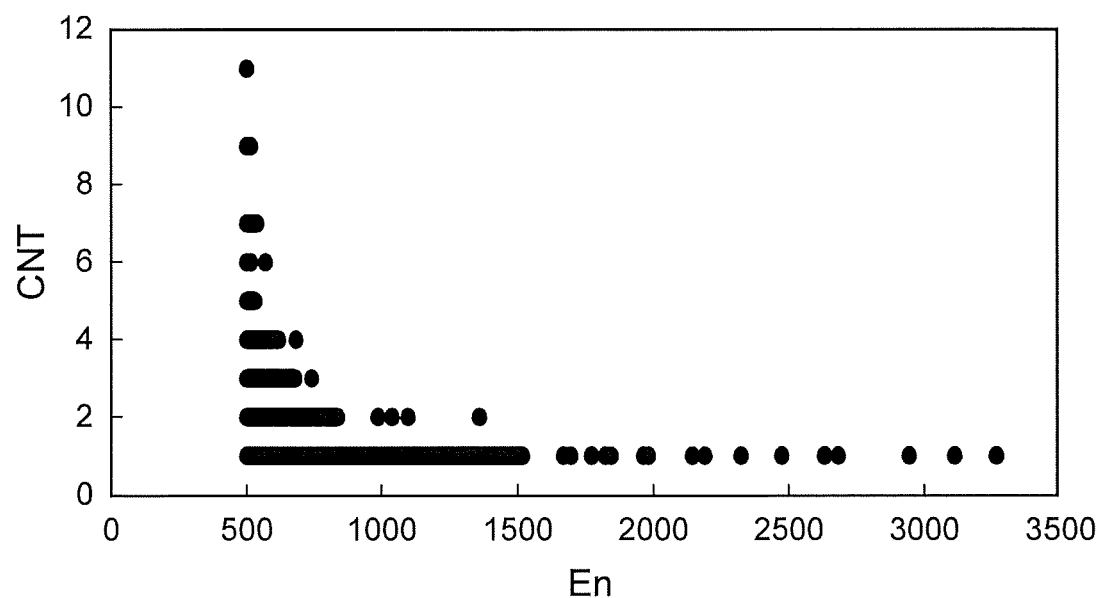

FIG. 3A and FIG. 3B are graphs illustrating the characteristic of the radiation detector.

In these figures, the horizontal axis is a channel number En (an ADC channel number) of an AD converter. The channel number En is a value proportional to the energy En of the radiation 81 incident on the radiation detector 110 (the detection element 30E). In the example, the radiation 81 that is used has thorium nitrate as a radiation source. The vertical axis is a count CNT of the detected signal. FIG. 3A corresponds to the case where there is no radiation source. FIG. 3B corresponds to the case where there is a radiation source. Even in the case where there is no radiation source as shown in FIG. 3A, the count CNT is displayed as the noise of the measurement system. In the case where there is a radiation source as shown in FIG. 3B, the count CNT of the entirety increases; and the count CNT that corresponds to the radiation 81 is obtained.

According to the embodiment, the radiation 81 (e.g., β-rays) can be discriminated from γ-rays and detected. The target radiation 81 (e.g., β-rays) can be detected with a high detection accuracy.

In another sample, the concentration of the first compound 31 in the organic semiconductor layer 30 is less than 50 weight %. In such a case, the radiation 81 is substantially not detected. For example, in the case where the concentration is less than 50 weight %, the volume fraction of the first compound 31 in the organic semiconductor layer 30 becomes excessively low. Therefore, it is considered that the charge generated when irradiated with radiation cannot be transported to the electrodes in the case where the concentration is less than 50 weight %.

In the case where the concentration of the first compound 31 in the organic semiconductor layer 30 is, for example, 50 weight %, the volume fraction is insufficient to transport the charge. Accordingly, it is favorable for the concentration to exceed 50 weight %. For example, it is favorable for the concentration to be 80 weight % or more.

As described above, it is desirable for the organic semiconductor layer 30 according to the embodiment to be formed by pressure molding. In such a case, a void may be formed inside the organic semiconductor layer 30. The void is formed uniquely by the pressure molding. For example, voids do not occur easily when coating using a solution, etc.

An example of the void will now be described.

Figure 4:
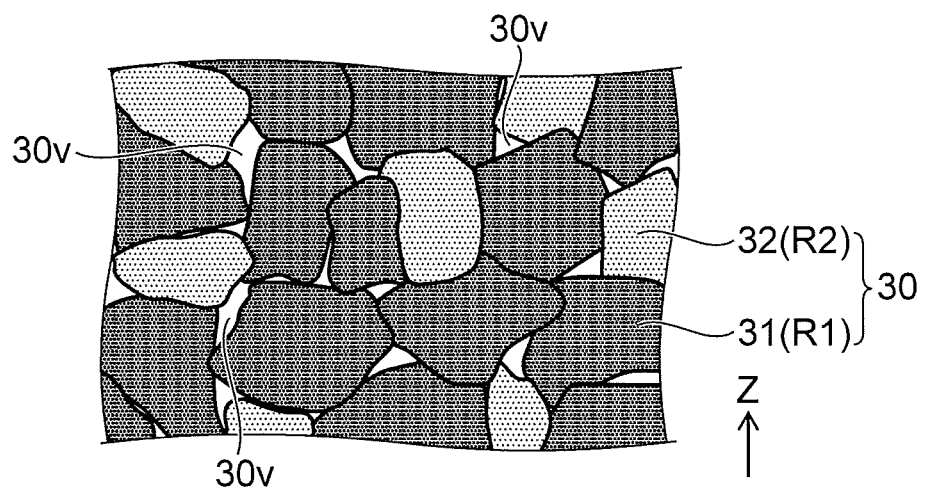
FIG. 4 is a schematic cross-sectional view illustrating a portion of the radiation detector according to the first embodiment.

FIG. 4 is a schematic cross-sectional view illustrating a portion of the radiation detector according to the first embodiment.

FIG. 4 schematically shows a portion of a cross section of the organic semiconductor layer 30. As shown in FIG. 4, the organic semiconductor layer 30 includes the first region R1 including the first compound 31, and the second region R2 including the second compound 32. The organic semiconductor layer 30 further includes a void 30v. The void 30v is provided between the first region R1 and the second region R2.

The density of the organic semiconductor layer 30 can be reduced by the void 30v. The relative dielectric constant of the organic semiconductor layer 30 can be reduced by the void 30v. Thereby, for example, the noise of the measurement system originating in the element capacitance can be reduced.

In the embodiment, the void fraction of the void 30v is, for example, not less than 0.1% and not more than 10%. When the void fraction is less than 0.01%, for example, the effect of the decrease of the density or the decrease of the relative dielectric constant is small. When the void fraction exceeds 10%, for example, the mechanical strength decreases. When the void fraction exceeds 10%, the transport property of the charge decreases.

In the embodiment, the first conductive layer 10 may include, for example, an oxide of a metal. The first conductive layer 10 may include, for example, ITO.

In the embodiment, the second conductive layer 20 includes, for example, a metal. The metal may include, for example, at least one selected from the group consisting of Al, Ag, and Au.

Figure 5:
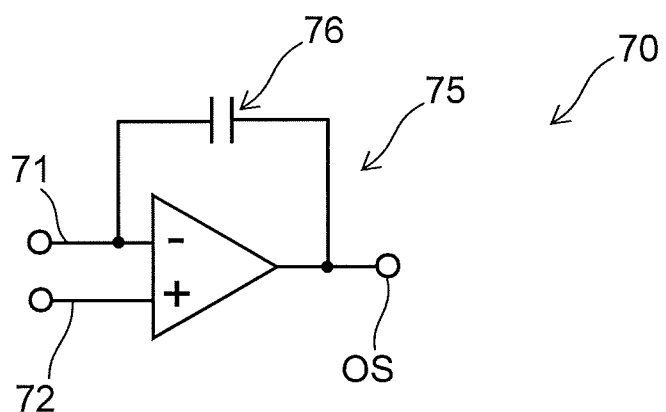
FIG. 5 is a circuit diagram illustrating a portion of the radiation detector according to the embodiment.

FIG. 5 is a circuit diagram illustrating a portion of the radiation detector according to the embodiment.

FIG. 5 illustrates a charge amplifier 75 provided in the detection circuit 70. The first interconnect 71 (i.e., the first conductive layer 10) is electrically connected to one of the two input terminals of the charge amplifier 75. The second interconnect 72 (i.e., the second conductive layer 20) is electrically connected to the other of the two input terminals of the charge amplifier 75. A capacitance 76 is connected between the negative input of the charge amplifier 75 and the output terminal of the charge amplifier 75. For example, a voltage that corresponds to the charge generated between the first conductive layer 10 and the second conductive layer 20 is obtained as the output signal OS.

A resistor may be provided in parallel with the capacitance 76 in the charge amplifier 75. An input terminal of a reference voltage may be further provided.

Figure 6:
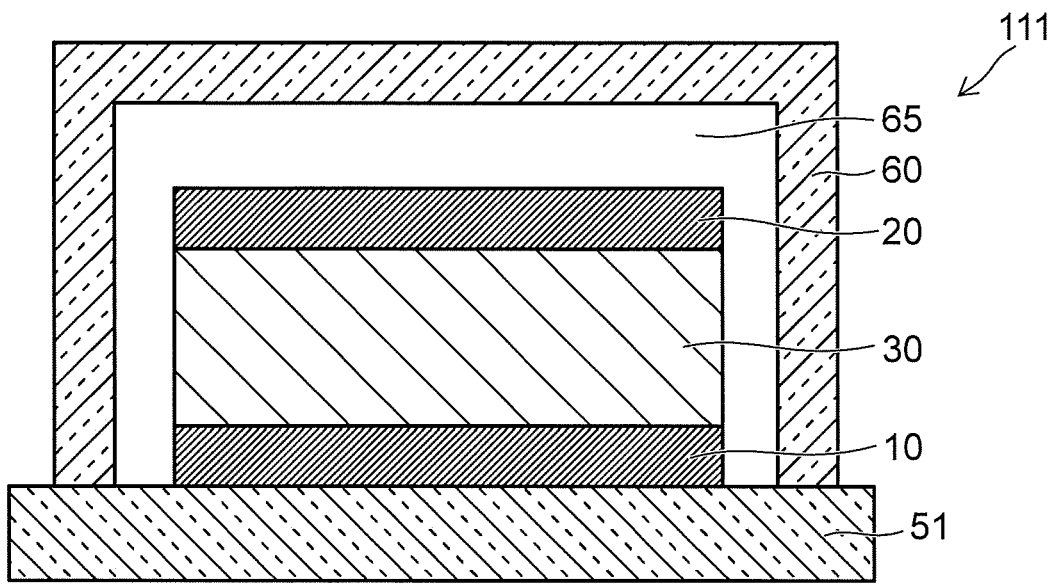
FIG. 6 is a schematic cross-sectional view illustrating a radiation detector according to the embodiment.

FIG. 6 is a schematic cross-sectional view illustrating a radiation detector according to the embodiment.

In the radiation detector 111 according to the embodiment as shown in FIG. 6, a sealing member 60 (the second member 52) is further provided in addition to the first conductive layer 10, the second conductive layer 20, the organic semiconductor layer 30, and the first member 51. For example, the first member 51 and the sealing member 60 include glass. The outer edge of the sealing member 60 is bonded to the outer edge of the first member 51. The first conductive layer 10, the second conductive layer 20, and the organic semiconductor layer 30 are provided in the space surrounded with the first member 51 and the sealing member 60. The first conductive layer 10, the second conductive layer 20, and the organic semiconductor layer 30 are sealed airtightly by the first member 51 and the sealing member 60. Thereby, stable characteristics are obtained easily. High reliability is obtained.

A space 65 is provided between the sealing member 60 and each of the first conductive layer 10, the second conductive layer 20, and the organic semiconductor layer 30. For example, an inert gas (e.g., a nitrogen gas or the like) is sealed in the space 65.

Figure 7:
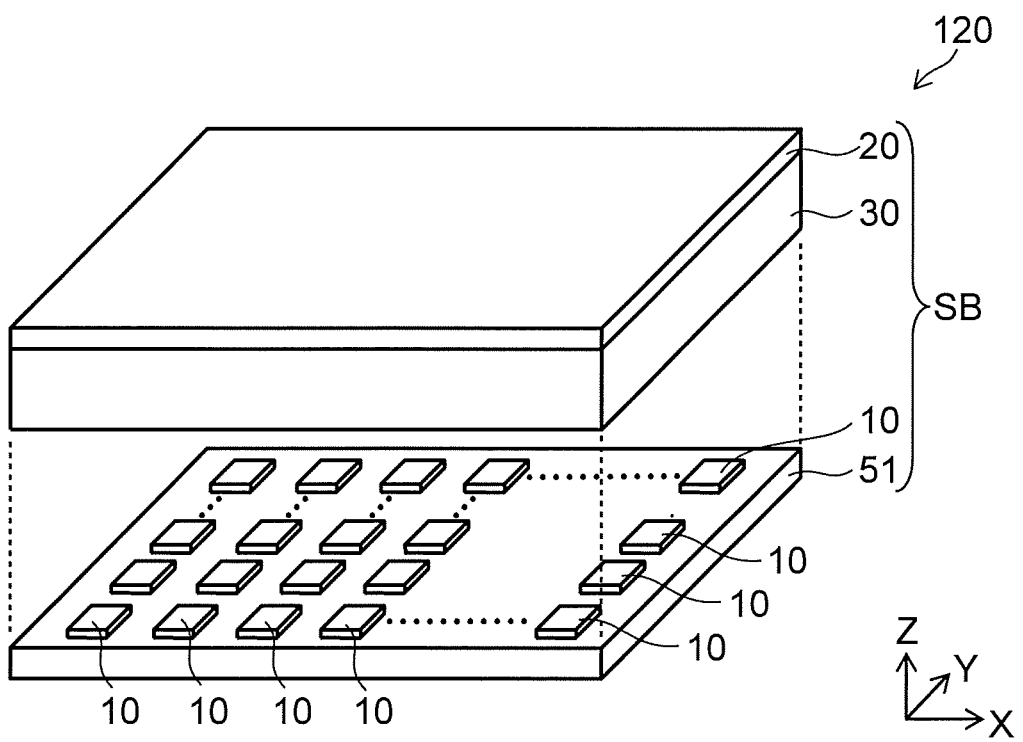
FIG. 7 is a schematic cross-sectional view illustrating a radiation detector according to the embodiment.

FIG. 7 is a schematic cross-sectional view illustrating a radiation detector according to the embodiment.

As shown in FIG. 7, multiple first conductive layers 10 are provided in the radiation detector 120. The multiple first conductive layers 10 are arranged along a plane (e.g., the X-Y plane) crossing a first direction (the Z-axis direction) toward the second conductive layer 20 from one of the multiple first conductive layers 10. The X-Y plane is perpendicular to the Z-axis direction. For example, the multiple first conductive layers 10 are arranged along an X-axis direction and a Y-axis direction. For example, the multiple first conductive layers 10 are arranged in a matrix configuration.

For example, an image that corresponds to the radiation 81 is obtained in the radiation detector 120. The configurations described in reference to the first embodiment and the second embodiment and modifications of the configurations are applicable to the radiation detector 120. In the radiation detector 120 as well, a radiation detector can be provided in which the detection accuracy can be increased.

Second Embodiment

A second embodiment relates to a method for manufacturing a radiation detector. In the manufacturing method, a mixture is prepared in which multiple particles including the bipolar first compound 31 and multiple particles including the second compound 32 are mixed. The manufacturing method includes forming the organic semiconductor layer 30 including the first compound 31 and the second compound 32 by applying pressure to the mixture. The thickness of the organic semiconductor layer 30 is 50 μm or more. The manufacturing method includes forming the first conductive layer 10 and the second conductive layer 20 that are electrically connected to the organic semiconductor layer 30.

The organic semiconductor layer 30 is provided between the first conductive layer 10 and the second conductive layer 20. By using pressure molding, the thickness t30 that is 50 μm or more can be obtained stably and uniformly.

According to the embodiments, a radiation detector and a method for manufacturing the radiation detector can be provided in which the detection accuracy can be increased.

In this specification, the state of being electrically connected includes the state in which two conductors are in direct contact. The state of being electrically connected includes the state in which two conductors are connected by another conductor (e.g., an interconnect, etc.). The state of being electrically connected includes the state in which a switching element (a transistor or the like) is provided in a path between two conductors so that a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, organic semiconductor layers, compounds, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors, and methods for manufacturing the same practicable by an appropriate design modification by one skilled in the art based on the radiation detectors, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
   a detection element, the detection element including:
   a first conductive layer;
   a second conductive layer; and
   an organic semiconductor layer provided between the first conductive layer and the second conductive layer, wherein the organic semiconductor layer includes a first organic compound and a second organic compound, the first organic compound being bipolar, and a thickness of the organic semiconductor layer is 50 μm or more.

2. A radiation detector, comprising:
a detection element, the detection element including:
a first conductive layer;
a second conductive layer; and
an organic semiconductor layer provided between the first conductive layer and the second conductive layer, wherein
the organic semiconductor layer includes a first compound and a second compound, and
the first compound includes at least one selected from the group consisting of boron subnaphthalocyanine chloride and a derivative of boron naphthalocyanine chloride.

3. The detector according to claim 2, wherein the second compound includes at least one selected from the group consisting of polyvinyl carbazole, polyfluorene, poly(9,9-dioctyl-9H-fluorene-2,7-diyl)-alt-2,2'-bithiophene-5,5'-diyl, and poly(9,9-dioctylfluorene-alt-benzothiadiazole).

4. A radiation detector, comprising:
a detection element, the detection element including:
a first conductive layer;
a second conductive layer; and
an organic semiconductor layer provided between the first conductive layer and the second conductive layer, wherein
the organic semiconductor layer includes a first compound and a second compound,
the first compound includes at least one selected from the group consisting of boron subnaphthalocyanine chloride and a derivative of boron naphthalocyanine chloride,
the second compound includes at least one selected from the group consisting of polyvinyl carbazole, polyfluorene, poly(9,9-dioctyl-9H-fluorene-2,7-diyl)-alt-2,2'-bithiophene-5,5'-diyl, and poly(9,9-dioctylfluorene-alt-benzothiadiazole), and
a thickness of the organic semiconductor layer is 50 μm or more.

5. The detector according to claim 2, wherein a concentration of the first compound in the organic semiconductor layer is not less than 50 weight % and not more than 95 weight %.

6. The detector according to claim 1, wherein the thickness of the organic semiconductor layer is 1000 μm or less.

7. The detector according to claim 1, wherein the organic semiconductor layer includes:
a first region including the first organic compound;
a second region including the second organic compound; and
a void between the first region and the second region.

8. The detector according to claim 7, wherein a void fraction of the void is not less than 0.01% and not more than 10%.

9. The detector according to claim 7, wherein a size of the void is not less than 0.1 μm and not more than 10 μm.

10. The detector according to claim 1, further comprising a detection circuit electrically connected to the first conductive layer and the second conductive layer,
wherein the detection circuit is configured to output a signal corresponding to radiation incident on the detection element.

11. The detector according to claim 1, wherein
the organic semiconductor layer includes:
a first region including the first organic compound; and
a second region including the second organic compound, and
a portion of the second region is between a plurality of portions of the first region.

12. The detector according to claim 1, wherein
the organic semiconductor layer includes:
a first region including the first organic compound; and
a second region including the second organic compound, and
a portion of the first region is between a plurality of portions of the second region.

13. The detector according to claim 1, wherein
the organic semiconductor layer includes a plurality of first particles including the first organic compound, and
an average size of the plurality of first particles is not less than 0.1 μm and not more than 10 μm.

14. The detector according to claim 1, wherein
the organic semiconductor layer includes a plurality of second particles including the second organic compound, and
an average size of the plurality of second particles is not less than 0.1 μm and not more than 10 μm.

15. The detector according to claim 1, wherein a detection sensitivity to β-rays is higher than a detection sensitivity to γ-rays.

16. The detector according to claim 1, wherein the thickness of the organic semiconductor layer is 100 μm or more.

17. A method for manufacturing a radiation detector, comprising:
forming an organic semiconductor layer including a first compound and a second compound by applying pressure to a mixture, a plurality of particles including the first compound and a plurality of particles including the second compound being mixed in the mixture, the first compound including at least one selected from the group consisting of boron subnaphthalocyanine chloride and a derivative of boron naphthalocyanine chloride, and a thickness of the organic semiconductor layer being 50 μm or more; and
forming a first conductive layer and a second conductive layer electrically connected to the organic semiconductor layer, the organic semiconductor layer being provided between the first conductive layer and the second conductive layer.

18. The detector according to claim 2, wherein a thickness of the organic semiconductor layer is 50 μm or more.

19. The detector according to claim 1, wherein electrons and holes are generated in the first compound when irradiated with radiation.

* * * * *